United States Patent
Ryu et al.

(10) Patent No.: US 12,176,745 B2
(45) Date of Patent: Dec. 24, 2024

(54) FORCED DISCHARGE TEST APPARATUS AND FORCED DISCHARGE TEST METHOD

(71) Applicant: LG ENERGY SOLUTION, LTD., Seoul (KR)

(72) Inventors: Sang-Woo Ryu, Daejeon (KR); Jee-Soon Choi, Daejeon (KR); Dal-Mo Kang, Daejeon (KR); Yong-Seok Choi, Daejeon (KR)

(73) Assignee: LG ENERGY SOLUTION, LTD., Seoul (KR)

( * ) Notice: Subject to any disclaimer, the term of this patent is extended or adjusted under 35 U.S.C. 154(b) by 455 days.

(21) Appl. No.: 17/774,094

(22) PCT Filed: Aug. 5, 2020

(86) PCT No.: PCT/KR2020/010349
§ 371 (c)(1),
(2) Date: May 3, 2022

(87) PCT Pub. No.: WO2021/096027
PCT Pub. Date: May 20, 2021

(65) Prior Publication Data
US 2022/0385084 A1    Dec. 1, 2022

(30) Foreign Application Priority Data
Nov. 13, 2019  (KR) .......... 10-2019-0145240

(51) Int. Cl.
*H02J 7/00*  (2006.01)
*G01K 3/00*  (2006.01)
(Continued)

(52) U.S. Cl.
CPC ............ *H02J 7/0047* (2013.01); *G01K 3/005* (2013.01); *G01R 31/386* (2019.01);
(Continued)

(58) Field of Classification Search
CPC ...... H02J 7/0047; H02J 7/0063; G01K 3/005; G01R 31/386; H01M 10/42;
(Continued)

(56) References Cited

U.S. PATENT DOCUMENTS

| 2011/0121787 A1* | 5/2011 | Kim .............. H01M 10/486 320/134 |
| 2011/0127945 A1* | 6/2011 | Yoneda ........... H01M 10/48 320/135 |
| 2020/0166580 A1* | 5/2020 | Jung .............. G01R 31/389 |

FOREIGN PATENT DOCUMENTS

| CN | 104008293 B | 4/2017 |
| CN | 207473061 U | 6/2018 |

(Continued)

OTHER PUBLICATIONS

Extended European Search Report issued on Sep. 22, 2022 in regards to the European Patent Application('EESR') No. 20886269.8.

(Continued)

*Primary Examiner* — Jeffrey P Aiello
(74) *Attorney, Agent, or Firm* — Birch, Stewart, Kolasch & Birch, LLP (57) ABSTRACT

A forced discharge test apparatus includes a heating circuit; a discharge circuit; a temperature sensor; and a controller. When the controller receives a test command indicating a test resistance and a test temperature, the controller outputs a first control signal to the heating circuit to increase the temperature of a battery cell. The controller outputs a second control signal to the discharge circuit to discharge the battery cell when the temperature of the battery cell reaches the set test temperature. The controller determines that the test temperature is valid with respect to the test resistance when the temperature of the battery cell is equal to or lower than the upper temperature limit at a time point at which a (Continued)

predetermined heating time has passed from a time point when the first control signal is outputted.

10 Claims, 6 Drawing Sheets

(51) Int. Cl.
  *G01R 31/00* (2006.01)
  *G01R 31/385* (2019.01)
  *H01M 10/42* (2006.01)
  *H01M 10/44* (2006.01)
  *H01M 10/48* (2006.01)
(52) U.S. Cl.
  CPC ..... *H01M 10/4285* (2013.01); *H01M 10/443* (2013.01); *H01M 10/486* (2013.01)
(58) Field of Classification Search
  CPC ............. H01M 10/4285; H01M 10/44; H01M 10/443; H01M 10/48; H01M 10/486; H01M 2010/4271; H02H 3/006; H02H 3/023; H02H 5/04; H02H 7/18; Y02E 60/10
  USPC ..... 180/65.29; 320/134, 106, 136, 127, 132, 320/152; 324/426, 76.11, 427, 430, 433; 702/63, 117, 58, 85, 64, 104, 118, 186, 702/189, 65
  See application file for complete search history.

(56) References Cited

FOREIGN PATENT DOCUMENTS

| EP | 0926796 A2 * | 6/1990 | ............. H01M 10/42 |
|---|---|---|---|
| EP | 3 367 475 A1 | 8/2018 | |
| EP | 3 401 980 A1 | 11/2018 | |
| JP | 11-326473 A | 11/1999 | |
| JP | 4909569 B2 | 4/2012 | |
| JP | 2013-17354 A | 1/2013 | |
| KR | 10-2008-0036260 A | 4/2008 | |
| KR | 10-0911315 B1 | 8/2009 | |
| KR | 10-0989969 B1 | 10/2010 | |
| KR | 10-2011-0058378 A | 6/2011 | |
| KR | 10-1135106 B1 | 4/2012 | |
| KR | 10-1800816 B1 | 11/2017 | |
| KR | 10-2018-0062815 A | 6/2018 | |
| KR | 10-2019-0092767 A | 8/2019 | |

OTHER PUBLICATIONS

International Search Report for PCT/KR2020/010349 (PCT/ISA/210) mailed on Nov. 27, 2020.

* cited by examiner

FORCED DISCHARGE TEST APPARATUS AND FORCED DISCHARGE TEST METHOD

TECHNICAL FIELD

The present disclosure relates to technology for determining the resistance of a resistor to be used to prevent thermal runaway of a battery cell and/or a cell group.

The present application claims priority to Korean Patent Application No. 10-2019-0145240 filed in the Republic of Korea on Nov. 13, 2019, the disclosure of which is incorporated herein by reference.

BACKGROUND ART

Recently, there has been a dramatic increase in demand for portable electronic products such as laptop computers, video cameras and mobile phones, and with the extensive development of electric vehicles, accumulators for energy storage, robots and satellites, many studies are being made on high performance batteries that can be recharged repeatedly.

Currently, commercially available batteries include nickel-cadmium batteries, nickel-hydrogen batteries, nickel-zinc batteries, lithium batteries and the like, and among them, lithium batteries have little or no memory effect, and thus they are gaining more attention than nickel-based batteries for their advantages that recharging can be done whenever it is convenient, the self-discharge rate is very low and the energy density is high.

When a battery is placed in a high temperature environment for a long time by the internal or external factors of the battery, a fire may occur in the battery. In this case, when a fire occurs in the battery, due to a large amount of heat emitted from the battery, the fire may spread to adjacent batteries, and this phenomenon is referred to as 'thermal runaway'.

Particularly, as the State Of Charge (SOC) of the battery is higher, a higher amount of heat is generated when a fire occurs. Accordingly, when an abnormal temperature of the battery is detected, it is necessary to forcibly discharge the battery to consume the internal energy of the battery, to reduce the risk of thermal runaway.

For safe forced discharge of the battery, it is important to appropriately select the resistance of a resistor that consumes the energy of the battery as Joule heat during forced discharge. When the resistance of the resistor is too low, the temperature of the resistor sharply rises, and rather, an amount of heat generated from the battery increases due to the forced discharge, and when the resistance of the resistor is too high, the internal energy of the battery decreases too slowly.

DISCLOSURE

Technical Problem

The present disclosure is designed to solve the above-described problem, and therefore the present disclosure is directed to providing an apparatus and method for performing a test for determining the resistance of a resistor used when forcibly discharging a battery cell and/or a cell group.

These and other objects and advantages of the present disclosure may be understood by the following description and will be apparent from the embodiments of the present disclosure. In addition, it will be easily understood that the objects and advantages of the present disclosure may be realized by the means set forth in the appended claims and a combination thereof.

Technical Solution

A forced discharge test apparatus according to an aspect of the present disclosure includes a heating circuit configured to heat at a predetermined heating rate in response to a first control signal, a discharge circuit connected in parallel to a battery cell of a battery and configured to discharge the battery cell in response to a second control signal, a temperature sensor configured to detect a cell temperature of the battery cell, and a controller operably coupled to the heating circuit, the discharge circuit and the temperature sensor. When m is a natural number of 2 or greater, n is a natural number of 2 or greater, i is a natural number of m or smaller and j is a natural number of n or smaller, the controller is configured to output the first control signal at a first time point in response to a test command including $i^{th}$ resistance setting information and $j^{th}$ temperature setting information being received. The $i^{th}$ resistance setting information indicates that a resistance of the discharge circuit is set to be equal to $i^{th}$ test resistance among first to $m^{th}$ test resistances. The $j^{th}$ temperature setting information requests the setting of a discharge start temperature to be equal to $j^{th}$ test temperature among first to $n^{th}$ test temperatures. The controller is configured to output the second control signal in response to the cell temperature reaching the $j^{th}$ test temperature at a second time point after the first time point. The controller is configured to determine that the $j^{th}$ test temperature is valid with respect to the $i^{th}$ test resistance when the cell temperature is equal to or lower than an upper temperature limit at a third time point at which a predetermined heating time has passed from the first time point.

The heating circuit may include a heating film provided to come into contact with the battery, and a power supply configured to apply a direct current voltage across the heating film in response to the first control signal. The direct current voltage has a magnitude corresponding to the predetermined heating rate.

The discharge circuit may include a resistor which is replaceable, and a switch connected in series to the resistor between a positive electrode terminal and a negative electrode terminal of the battery cell. The switch is turned on by the second control signal.

The controller may be configured to determine first to $m^{th}$ threshold temperatures associated with the first to $m^{th}$ test resistances respectively. The $i^{th}$ threshold temperature is a maximum test temperature determined to be valid with respect to the $i^{th}$ test resistance among the first to $n^{th}$ test temperatures.

The controller may be configured to determine a maximum value of the first to $m^{th}$ threshold temperatures as an optimum temperature. The controller may be configured to determine a test resistance associated with the optimum temperature as a first optimum resistance for preventing thermal runaway of the battery cell.

The controller may be configured to determine a second optimum resistance for preventing thermal runaway of a cell group including the battery cell based on cell array information of the cell group and the first optimum resistance. The cell array information includes a first number of cell strings included in the cell group and a second number of battery cells included in each cell string.

The controller may be configured to determine the second optimum resistance using the following equation:

$$R_{OPT\_2} = \frac{R_{OPT\_1} \times Y}{X} \quad \langle\text{Equation}\rangle$$

($R_{OPT\_1}$ is the first optimum resistance, X is the first number, Y is the second number, and $R_{OPT\_2}$ is the second optimum resistance).

The forced discharge test apparatus may further include a press jig provided to press the heating film and the battery.

The forced discharge test apparatus may further include an interface configured to output the test command to the control unit.

A forced discharge test method according to another aspect of the present disclosure uses the forced discharge test apparatus, and the forced discharge test method includes outputting the first control signal at the first time point in response to the test command being received, outputting the second control signal in response to the cell temperature reaching the $j^{th}$ test temperature at the second time point after the first time point, and determining that the $j^{th}$ test temperature is valid with respect to the $i^{th}$ test resistance when the cell temperature is equal to or lower than the upper temperature limit at the third time point at which the predetermined heating time has passed from the first time point.

Advantageous Effects

According to at least one of the embodiments of the present disclosure, it is possible to determine the resistance of a resistor used to forcibly discharge a battery cell and/or a cell group.

The effects of the present disclosure are not limited to the above-mentioned effects, and these and other effects will be clearly understood by those skilled in the art from the appended claims.

BRIEF DESCRIPTION OF THE DRAWINGS

The accompanying drawings illustrate a preferred embodiment of the present disclosure, and together with the detailed description of the present disclosure described below, serve to provide a further understanding of the technical aspects of the present disclosure, and thus the present disclosure should not be construed as being limited to the drawings.

DETAILED DESCRIPTION

Hereinafter, the preferred embodiments of the present disclosure will be described in detail with reference to the accompanying drawings. Prior to the description, it should be understood that the terms or words used in the specification and the appended claims should not be construed as being limited to general and dictionary meanings, but rather interpreted based on the meanings and concepts corresponding to the technical aspects of the present disclosure on the basis of the principle that the inventor is allowed to define the terms appropriately for the best explanation.

Therefore, the embodiments described herein and illustrations shown in the drawings are just a most preferred embodiment of the present disclosure, but not intended to fully describe the technical aspects of the present disclosure, so it should be understood that a variety of other equivalents and modifications could have been made thereto at the time that the application was filed.

The terms including the ordinal number such as "first", "second" and the like, are used to distinguish one element from another among various elements, but not intended to limit the elements by the terms.

Unless the context clearly indicates otherwise, it will be understood that the term "comprises" when used in this specification, specifies the presence of stated elements, but does not preclude the presence or addition of one or more other elements. Additionally, the term "control unit" as used herein refers to a processing unit of at least one function or operation, and may be implemented by hardware or software alone or in combination.

In addition, throughout the specification, it will be further understood that when an element is referred to as being "connected to" another element, it can be directly connected to the other element or intervening elements may be present.

Figure 1:
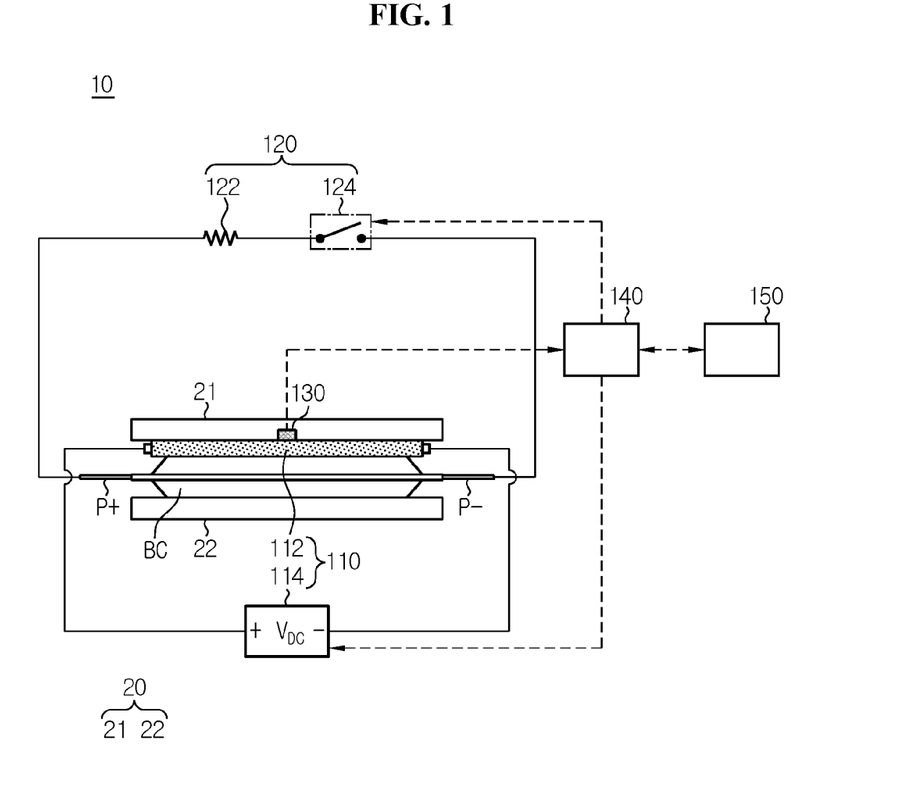
FIG. 1 is a diagram exemplarily showing a configuration of a forced discharge test apparatus according to the present disclosure.
Figure 2:
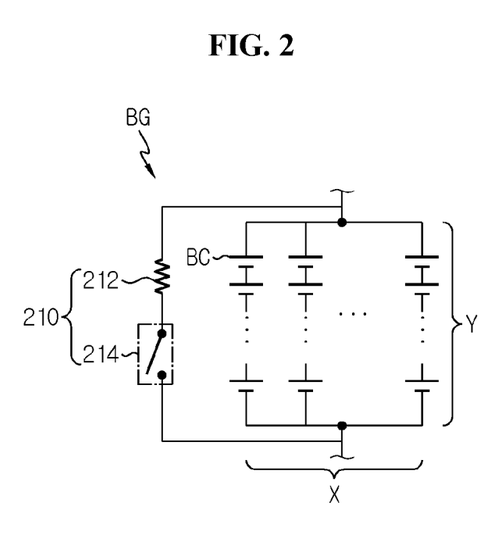
FIG. 2 is a diagram referenced in describing arrangement information of a cell group.

FIG. 1 is a diagram exemplarily showing a configuration of a forced discharge test apparatus 10 according to the present disclosure, and FIG. 2 is a diagram referenced in describing arrangement information of a cell group BG.

Referring to FIG. 1, the forced discharge test apparatus 10 (hereinafter referred to as 'test apparatus') may include a heating circuit 110, a discharge circuit 120, a temperature sensor 130 and a control unit 140. The test apparatus 10 may further include at least one of a press jig 20 or an interface unit 150.

The heating circuit 110 is configured to heat at a predetermined heating rate (for example, 30° C./min) in response to a first control signal. The heating circuit 110 may include a heating film 112 and a power supply 114. The power supply 114 applies a direct current voltage across the heating film 112 in response to the first control signal. The direct current voltage has a magnitude corresponding to the predetermined heating rate. The power supply 114 adjusts the magnitude of the direct current voltage applied across the heating film 112 according to a predetermined direct current voltage profile for a predetermined heating time in response to the first control signal. When the heating film 112 heats by the direct current voltage, the temperature of the heating film 112 increases at the predetermined heating rate.

The discharge circuit 120 may be connected in parallel to a battery cell BC. The discharge circuit 120 is provided to form a discharge path between a positive electrode terminal (P+) and a negative electrode terminal (P−) of the battery cell BC in response to a second control signal. The discharge circuit 120 may include a resistor 122 and a switch 124. The resistor 122 is replaceable, and m resistors 122 having first to $m^{th}$ test resistances (m is a natural number of 2 or greater) are prepared for a forced discharge test according to the present disclosure. Alternatively, the resistor 122 may be a variable resistor that can set the resistance of the resistor 122 to be equal to any one of the first to $m^{th}$ test resistances, in response to a command from the control unit 140. The switch 124 is turned on by the second control signal, and may be a known switching device such as a Metal Oxide Semiconductor Field Effect Transistor (MOSFET).

The press jig 20 is provided to press a stack of the battery cell BC and the heating film 112 in two directions to uniformly keep the battery cell BC and the heating film 112 in contact state during the forced discharge test. The press jig 20 may include a pair of press plates 21, 22. As shown in FIG. 1, when the heating film 112 is stacked on the upper surface of the battery cell BC, the press plate 21 may be disposed on the upper surface of the heating film 112, and the press plate 22 may be disposed on the lower surface of the battery cell BC.

The temperature sensor 130 is provided to detect the cell temperature of the battery cell BC during the forced discharge test. A signal indicating the detected cell temperature is transmitted from the temperature sensor 130 to the control unit 140. The temperature sensor 130 may include a known temperature detection device, such as, for example, a thermocouple. The temperature sensor 130 may be disposed at a preset location between the press plate 21 and the heating film 112 or between the heating film 112 and the battery cell BC or between the battery cell BC and the press plate 22.

The control unit 140 is operably coupled to the power supply 114, the switch 124 and the temperature sensor 130.

The control unit 140 may be implemented in hardware using at least one of application specific integrated circuits (ASICs), digital signal processors (DSPs), digital signal processing devices (DSPDs), programmable logic devices (PLDs), field programmable gate arrays (FPGAs), microprocessors, or electrical units for performing other functions. The control unit 140 may include memory therein. The memory may store programs and data necessary to perform a method as described below. The memory may include, for example, at least one type of storage medium of flash memory type, hard disk type, Solid State Disk (SSD) type, Silicon Disk Drive (SDD) type, multimedia card micro type, random access memory (RAM), static random access memory (SRAM), read-only memory (ROM), electrically erasable programmable read-only memory (EEPROM), or programmable read-only memory (PROM).

The interface unit 150 is provided to receive a user input for the forced discharge test, and generate a test command based on the received user input. The interface unit 150 includes an information input device to receive the user input, such as, for example, a mouse, a keyboard, a touchpad, a camera and a microphone. Additionally, the interface unit 150 may further include an information output device such as, for example, a speaker and a display.

The control unit 140 may determine a first optimum resistance which is a resistance of a resistor to be used to prevent thermal runaway of the battery cell BC based on the result of the forced discharge test performed on the battery cell BC. The control unit 140 may additionally determine a second optimum resistance which is a resistance of a resistor 212 to be used to prevent thermal runaway of the cell group BG including the plurality of battery cells BC.

Referring to FIG. 2, the cell group BG having cell array information of X×Y is illustrated. X denotes the number of cell strings, and Y denotes the number of battery cells BC included in the cell string. The cell string is a serial circuit of Y battery cells BC. For example, the cell array information of the cell group BG including 2 cell strings, each including 4 battery cells BC may be represented in 2×4.

A discharge circuit 210 is provided to be connected in parallel to the cell group BG. The discharge circuit 210 includes a resistor 212 and a switch 214. The control unit 140 may generate information associated with the second optimum resistance of the resistor 212 based on the result of the forced discharge test performed on the battery cell BC. The switch 214 may be a known switching device such as a Metal Oxide Semiconductor Field Effect Transistor (MOSFET).

The forced discharge test according to the present disclosure uses each of different first to $n^{th}$ test temperatures (n is a natural number of 2 or greater) as a discharge start temperature, for each of m resistors 122 having different first to $m^{th}$ test resistances. Accordingly, the forced discharge test may be performed m×n times in total.

Hereinafter, for convenience of description, assume that m=7, n=5, the first to $m^{th}$ test resistances are as shown in the following Table 1, and the first to $n^{th}$ test temperatures are as shown in the following Table 2.

TABLE 1

| | |
|---|---|
| $R_1$ | 1 mΩ |
| $R_2$ | 5 mΩ |
| $R_3$ | 10 mΩ |
| $R_4$ | 20 mΩ |
| $R_5$ | 40 mΩ |
| $R_6$ | 70 mΩ |
| $R_7$ | 100 mΩ |

TABLE 2

| | |
|---|---|
| $T_1$ | 50° C. |
| $T_2$ | 80° C. |
| $T_3$ | 110° C. |
| $T_4$ | 140° C. |
| $T_5$ | 170° C. |

Figure 3:
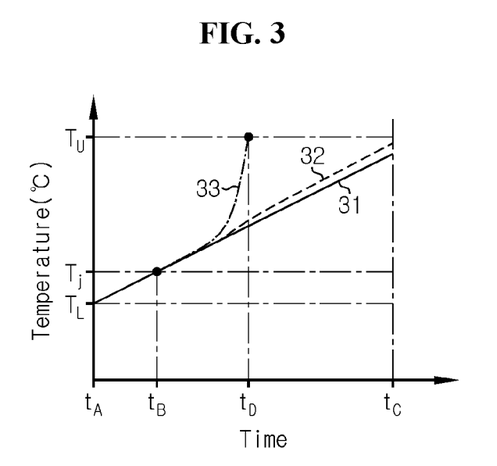
FIG. 3 is a diagram exemplarily showing a temperature change of a battery cell after a forced discharge test.

In Table 1, when i=1~7, $R_i$ denotes the $i^{th}$ test resistance. In Table 2, when j=1-5, $T_j$ denotes the $j^{th}$ test temperature. FIG. 3 is a diagram exemplarily showing a temperature change of the battery cell BC after the forced discharge test. In FIG. 3, a curve 31 shows a temperature change of the heating film 112, a curve 32 shows a change in cell temperature over time when a fire does not occur in the battery cell BC, and a curve 33 shows a change in cell temperature over time when a fire occurs in the battery cell BC.

Assume that each curve is obtained through the forced discharge test using the resistor having the $i^{th}$ test resistance $R_i$ as the resistor 122 of FIG. 1 and the $j^{th}$ test temperature $T_j$ as the discharge start temperature.

Referring to FIGS. 1 to 3, at a time point $t_A$ when the cell temperature is equal to or lower than a predetermined lower temperature limit $T_L$, the control unit 140 outputs the first control signal. Accordingly, from the time point $t_A$, the temperature of the heating film 112 increases as shown in the curve 31.

At a time point $t_B$ after the time point $t_A$, the cell temperature reaches the $j^{th}$ test temperature $T_j$ as the discharge start temperature. The control unit 140 outputs the second control signal at the time point $t_B$. Accordingly, the switch 124 is turned on from the time point $t_B$, and the battery cell BC is forcibly discharged by the resistor 122 having the $i^{th}$ test resistance $R_i$.

A time point $t_C$ is a time point at which the predetermined heating time has passed from the time point $t_A$. During the period of time from the time point $t_B$ to the time point $t_C$, the temperature of the heating film 112 gradually increases and the internal energy of the battery cell BC is gradually consumed by the resistor 122 having the $i^{th}$ test resistance $R_i$.

As in the curve 32, when the cell temperature changes in the range of a predetermined upper temperature limit $T_U$ or less until the time point $t_C$, the control unit 140 may determine that the $j^{th}$ test temperature is valid with respect to the $i^{th}$ test resistance $R_i$.

On the contrary, as in the curve 33, when the cell temperature exceeds the predetermined upper temperature limit $T_U$ at a time point $t_D$ earlier than the time point $t_C$, the control unit 140 may determine that the $j^{th}$ test temperature is invalid with respect to the $i^{th}$ test resistance $R_i$.

Figure 4:
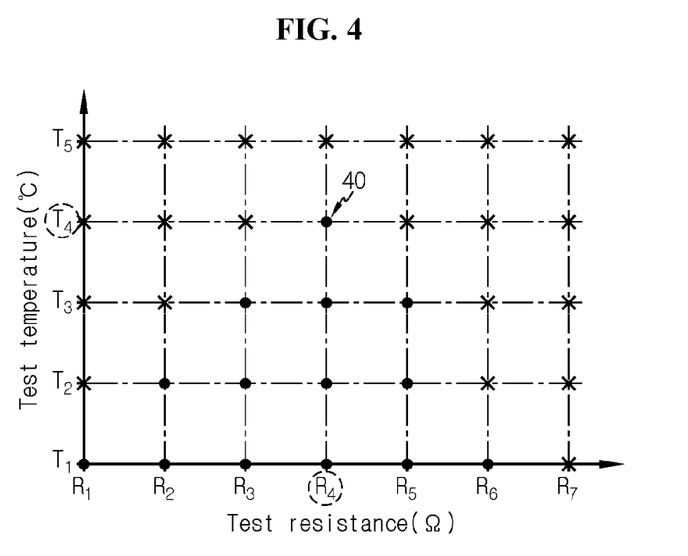
FIG. 4 is a diagram exemplarily showing the result of performing the forced discharge test of FIG. 3 once, for each of 35 test resistance-test temperature pairs that can be combined from 7 test resistances and 5 test temperatures.

FIG. 4 is a diagram exemplarily showing the result of performing the forced discharge test of FIG. 3 once, for each of 35 test resistance-test temperature pairs that can be combined from 7 test resistances and 5 test temperatures.

In the graph of FIG. 4, when i=1~7, j=1~5, the intersection between the vertical line corresponding to the $i^{th}$ test resistance $R_i$ and the horizontal line corresponding to the $j^{th}$ test temperature $T_j$ marked with the symbol '●' indicates that the $j^{th}$ test temperature $T_j$ was determined to be valid with respect to the $i^{th}$ test resistance $R_i$. For example, as the intersection 40 is marked with ●, it can be seen that $T_4$ was determined to be valid with respect to $R_4$.

In contrast, the intersection between the vertical line corresponding to the $i^{th}$ test resistance $R_i$ and the horizontal line corresponding to the $j^{th}$ test temperature $T_j$ marked with the symbol 'x' indicates that the $j^{th}$ test temperature $T_j$ was determined to be invalid with respect to the $i^{th}$ test resistance $R_i$.

Referring to FIG. 4, a test temperature determined to be valid with respect to $R_1$ is $T_1$. A test temperature determined to be valid with respect to $R_2$ is $T_1$, $T_2$. A test temperature determined to be valid with respect to $R_3$ is $T_1$, $T_2$, $T_3$. A test temperature determined to be valid with respect to $R_4$ is $T_1$, $T_2$, $T_3$, $T_4$. A test temperature determined to be valid with respect to $R_5$ is $T_1$, $T_2$, $T_3$. A test temperature determined to be valid with respect to $R_6$ is $T_1$. There is no test temperature determined to be valid with respect to $R_7$.

The control unit 140 determines $i^{th}$ threshold temperature associated with the $i^{th}$ test resistance. The $i^{th}$ threshold temperature is a maximum value of the test temperature determined to be valid with respect to the $i^{th}$ test resistance. For example, referring to FIG. 4, a first threshold temperature may be determined as $T_1$, a second threshold temperature as $T_2$, a third threshold temperature as $T_3$, a fourth threshold temperature as $T_4$, a fifth threshold temperature as $T_3$, and a sixth threshold temperature as $T_1$. As there is no test temperature determined to be valid with respect to $R_7$, in this case, a default value preset to be $T_1$ or less (for example, 0° C.) may be determined as a seventh threshold temperature.

The control unit 140 may determine a maximum value of the first to seventh threshold temperatures as an optimum temperature, and determine a test resistance associated with the optimum temperature as a first optimum resistance. For example, referring to FIG. 4, the maximum value $T_4$ of the first to seventh threshold temperatures may be determined as the optimum temperature, and $R_4$ associated with $T_4$ may be determined as the first optimum resistance.

The control unit 140 may transmit first test result data indicating the optimum temperature and the first optimum resistance to the interface unit 150. The interface unit 150 may convert the first test result data into a recognizable format and output it. Each of the optimum temperature and the first optimum resistance may be used as the discharge start temperature and the resistance of the resistor 122 to prevent thermal runaway of the actual battery cell BC.

The control unit 140 may determine the second optimum resistance based on the cell array information X×Y of the cell group BG and the first optimum resistance. The cell array information X×Y may be received through the interface unit 150. The second optimum resistance may be determined by the following equation.

$$R_{OPT\_2} = \frac{R_{OPT\_1} \times Y}{X} \qquad \langle\text{Equation}\rangle$$

In Equation, $R_{OPT\_1}$ denotes the first optimum resistance, X denotes the number of cell strings, Y denotes the number of battery cells BC included in each cell string, and $R_{OPT\_2}$ denotes the second optimum resistance.

The control unit 140 may transmit second test result data indicating the optimum temperature and the second optimum resistance to the interface unit 150. The interface unit 150 may convert the second test result data into a recognizable format and output it. Each of the optimum temperature and the second optimum resistance may be used as resistance of the discharge start temperature and the resistor 212 to prevent thermal runaway of the actual cell group BG.

Figure 5:
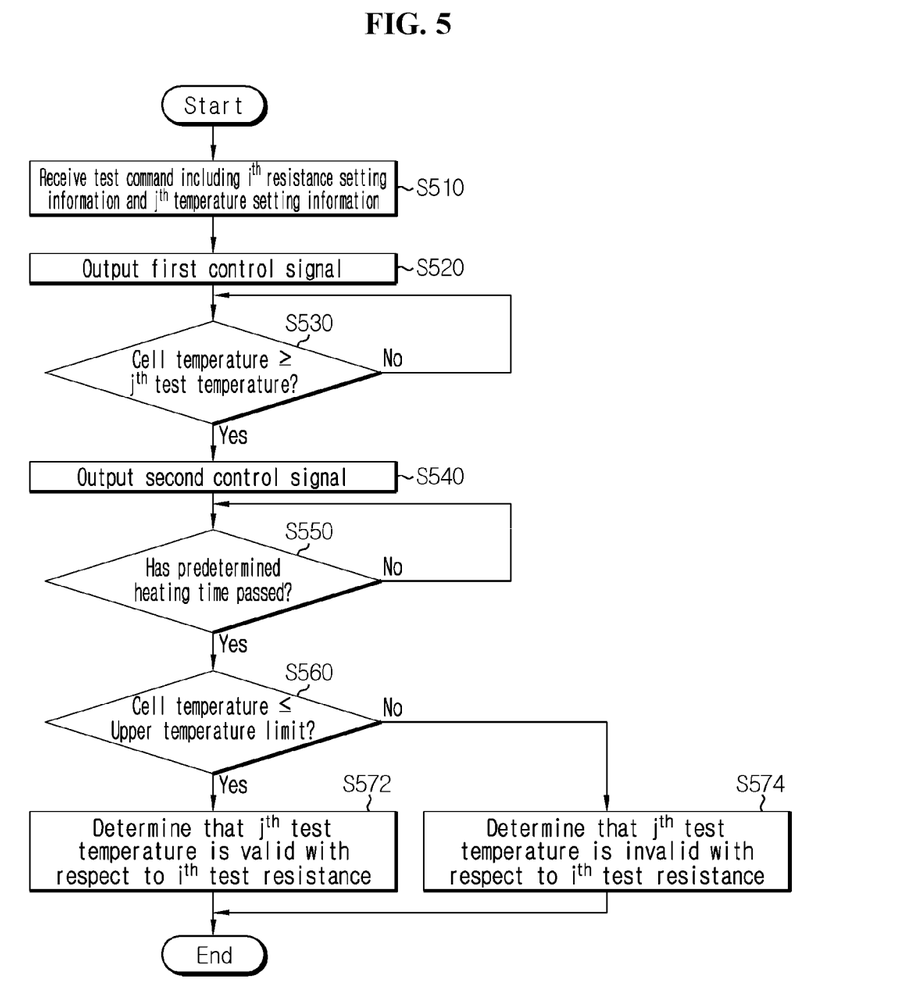
FIG. 5 is a flowchart exemplarily showing a method for forced discharge test according to a first embodiment of the present disclosure.

FIG. 5 is a flowchart exemplarily showing a method for forced discharge test according to a first embodiment of the present disclosure.

Referring to FIGS. 1 to 5, in step S510, the control unit 140 receives a test command including $i^{th}$ resistance setting information and $j^{th}$ temperature setting information through the interface unit 150. The $i^{th}$ resistance setting information indicates that the resistance of the resistor 122 included in the discharge circuit 120 is equal to the $i^{th}$ test resistance among the first to $m^{th}$ test resistances. Alternatively, when the resistor 122 is a variable resistor, the control unit 140 may set the resistance of the resistor 122 to be equal to the $i^{th}$ test resistance in response to the $i^{th}$ resistance setting information. The $j^{th}$ temperature setting information is information requesting the setting of the $j^{th}$ test temperature among the first to $n^{th}$ test temperatures as the discharge start temperature.

In step S520, the control unit 140 outputs a first control signal. The first control signal may be outputted when the cell temperature is equal to or lower than a predetermined lower temperature limit $T_L$ in response to the test command being received. By the first control signal, the heating film 112 heats at the predetermined heating rate.

In step S530, the control unit 140 determines whether the cell temperature reached the $j^{th}$ test temperature. That is, the control unit 140 determines whether to start to forcibly discharge the battery cell BC. When a value of the step S530 is "Yes", step S540 is performed.

In step S540, the control unit 140 outputs a second control signal. When the switch 124 is turned on by the second control signal, the internal energy of the battery cell BC is consumed by the resistor 122 having the $i^{th}$ test resistance.

In step S550, the control unit 140 determines whether a predetermined heating time has passed. When a value of the step S550 is "Yes", step S560 is performed.

In step S560, the control unit 140 determines whether the cell temperature is equal to or lower than a predetermined upper temperature limit $T_U$. When a value of the step S560 is "Yes", step S572 is performed. When the value of the step S560 is "No", step S574 is performed.

In step S572, the control unit 140 determines that the $j^{th}$ test temperature is valid with respect to the $i^{th}$ test resistance. In the forced discharge using the $i^{th}$ test resistance, when the $j^{th}$ test temperature is used as the discharge start temperature, this indicates the probability that thermal runaway of the battery cell BC occurs is less than the threshold.

In step S574, the control unit 140 determines that the $j^{th}$ test temperature is invalid with respect to the $i^{th}$ test resistance. In the forced discharge using the $i^{th}$ test resistance, when the $j^{th}$ test temperature is used as the discharge start temperature, this indicates the probability of thermal runaway of the battery cell BC is equal to or higher than the threshold.

The control unit 140 may perform the method shown in FIG. 5 once for each of m×n test resistances-test temperature pairs that can be combined from m test resistances and n test temperatures. Subsequently, the method of FIG. 6 may be performed.

Figure 6:
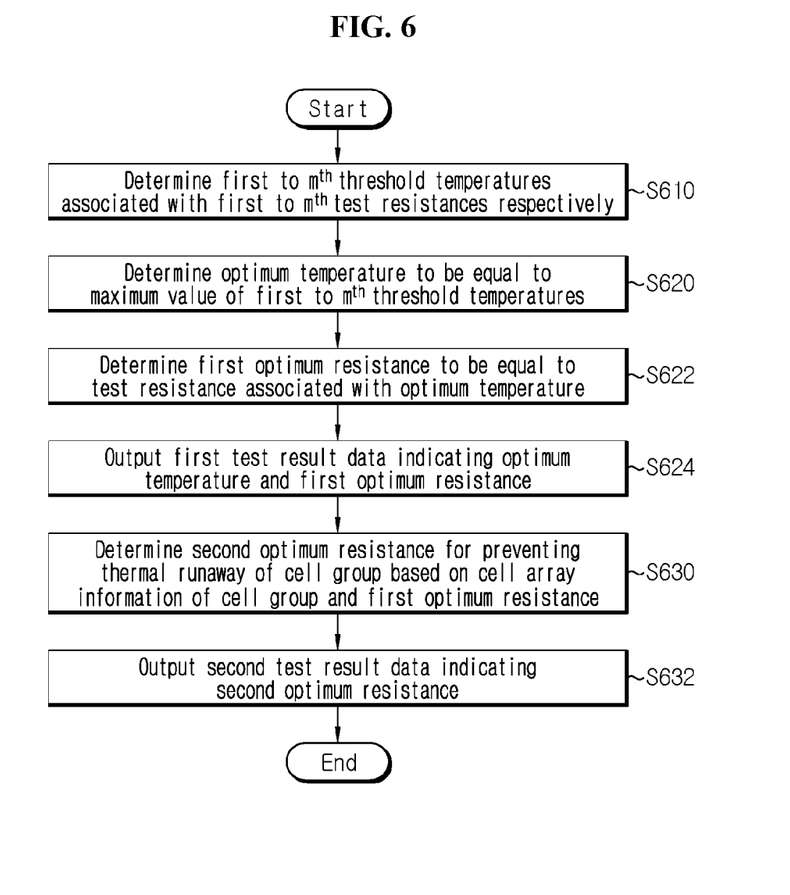
FIG. 6 is a flowchart exemplarily showing a method for determining an optimum resistance for a cell group according to a second embodiment of the present disclosure.

FIG. 6 is a flowchart exemplarily showing a method for determining an optimum resistance for the cell group BG according to a second embodiment of the present disclosure.

Referring to FIGS. 1 to 6, in step S610, the control unit 140 determines first to $m^{th}$ threshold temperatures associated with first to $m^{th}$ test resistances respectively. When i=1~m, the $i^{th}$ threshold temperature is a maximum value of at least one test temperature determined to be valid with respect to the $i^{th}$ test resistance.

In step S620, the control unit 140 determines an optimum temperature to be equal to a maximum value of first to $m^{th}$ threshold temperatures.

In step S622, the control unit 140 determines a first optimum resistance for preventing thermal runaway of the battery cell BC to be equal to a test resistance associated with the optimum temperature.

In step S624, the control unit 140 outputs first test result data indicating the optimum temperature and the first optimum resistance.

In step S630, the control unit 140 determines a second optimum resistance for preventing thermal runaway of the cell group BG based on cell array information of the cell group BG and the first optimum resistance.

In step S632, the control unit 140 outputs second test result data indicating the second optimum resistance.

The embodiments of the present disclosure described hereinabove are not implemented only through the apparatus and method, and may be implemented through programs that realize the functions corresponding to the configurations of the embodiments of the present disclosure or recording media having the programs recorded thereon, and such implementation may be easily achieved by those skilled in the art from the disclosure of the embodiments previously described.

While the present disclosure has been hereinabove described with regard to a limited number of embodiments and drawings, the present disclosure is not limited thereto and it is obvious to those skilled in the art that various modifications and changes may be made thereto within the technical aspects of the present disclosure and the equivalent scope of the appended claims.

Additionally, as many substitutions, modifications and changes may be made to the present disclosure by those skilled in the art without departing from the technical aspects of the present disclosure, the present disclosure is not limited by the foregoing embodiments and the accompanying drawings, and some or all of the embodiments may be selectively combined to make various modifications to the present disclosure.

What is claimed is:

1. A forced discharge test apparatus for a battery cell of a battery, comprising:
   a heating circuit configured to heat at a predetermined heating rate in response to a first control signal;
   a discharge circuit connected in parallel to the battery cell and configured to discharge the battery cell in response to a second control signal;
   a temperature sensor configured to detect a cell temperature of the battery cell; and
   a controller operably coupled to the heating circuit, the discharge circuit and the temperature sensor,
   wherein the controller is configured to:
   output the first control signal at a first time point in response to a test command being received, the test command including ith resistance setting information indicating that a resistance of the discharge circuit is set to be equal to ith test resistance among first to mth test resistances and jth temperature setting information requesting the setting of a discharge start temperature to be equal to jth test temperature among first to nth test temperatures,
   output the second control signal in response to the cell temperature reaching the jth test temperature at a second time point after the first time point, and
   determine that the jth test temperature is valid with respect to the ith test resistance when the cell temperature is equal to or lower than an upper temperature limit at a third time point at which a predetermined heating time has passed from the first time point, and
   wherein m is a natural number of 2 or greater, n is a natural number of 2 or greater, i is a natural number of m or smaller, and j is a natural number of n or smaller.

2. The forced discharge test apparatus according to claim 1, wherein the heating circuit includes:
   a heating film provided to come into contact with the battery; and
   a power supply configured to apply a direct current voltage across the heating film in response to the first control signal, the direct current voltage having a magnitude corresponding to the predetermined heating rate.

3. The forced discharge test apparatus according to claim 1, wherein the discharge circuit includes:
   a resistor which is replaceable; and
   a switch connected in series to the resistor between a positive electrode terminal and a negative electrode terminal of the battery cell, and
   wherein the switch is turned on by the second control signal.

4. The forced discharge test apparatus according to claim 1, wherein the controller is configured to determine first to mth threshold temperatures associated with the first to mth test resistances respectively, and
   the ith threshold temperature is a maximum test temperature determined to be valid with respect to the ith test resistance among the first to nth test temperatures.

5. The forced discharge test apparatus according to claim 4, wherein the controller is configured to:
   determine a maximum value of the first to mth threshold temperatures as an optimum temperature, and
   determine a test resistance associated with the optimum temperature as a first optimum resistance for preventing thermal runaway of the battery cell.

6. The forced discharge test apparatus according to claim 5, wherein the controller is configured to determine a second optimum resistance for preventing thermal runaway of a cell group including the battery cell based on cell array information of the cell group and the first optimum resistance, and wherein the cell array information includes a first number of cell strings included in the cell group and a second number of battery cells included in each cell string.

7. The forced discharge test apparatus according to claim 6, wherein the controller is configured to determine the second optimum resistance using the following equation:

$$R_{OPT\_2} = \frac{R_{OPT\_1} \times Y}{X} \quad \langle\text{Equation}\rangle$$

wherein ROPT_1 is the first optimum resistance, X is the first number, Y is the second number, and ROPT_2 is the second optimum resistance.

8. The forced discharge test apparatus according to claim 2, further comprising:
a press jig provided to press the heating film and the battery.

9. The forced discharge test apparatus according to claim 1, further comprising:
an interface configured to output the test command to the controller.

10. A forced discharge test method using the forced discharge test apparatus according to claim 1, the method comprising:
outputting the first control signal at the first time point in response to the test command being received;
outputting the second control signal in response to the cell temperature reaching the jth test temperature at the second time point after the first time point; and
determining that the jth test temperature is valid with respect to the ith test resistance when the cell temperature is equal to or lower than the upper temperature limit at the third time point at which the predetermined heating time has passed from the first time point.

* * * * *